(12) United States Patent
Kim

(10) Patent No.: US 9,048,346 B2
(45) Date of Patent: Jun. 2, 2015

(54) SEMICONDUCTOR LIGHT EMITTING DEVICE INCLUDING A METAL NITRIDE BUFFER LAYER AND FABRICATION METHOD THEREOF

(75) Inventor: Kyong Jun Kim, Gwangju (KR)

(73) Assignee: LG INNOTEK CO., LTD., Seoul (KR)

( * ) Notice: Subject to any disclaimer, the term of this patent is extended or adjusted under 35 U.S.C. 154(b) by 585 days.

(21) Appl. No.: 11/734,872

(22) Filed: Apr. 13, 2007

(65) Prior Publication Data

US 2007/0241350 A1 Oct. 18, 2007

(30) Foreign Application Priority Data

Apr. 14, 2006 (KR) .................. 10-2006-0033828

(51) Int. Cl.
*H01L 33/00* (2010.01)
*H01L 33/12* (2010.01)
*H01L 21/02* (2006.01)

(52) U.S. Cl.
CPC .......... *H01L 33/007* (2013.01); *H01L 21/0237* (2013.01); *H01L 21/02381* (2013.01); *H01L 21/02458* (2013.01); *H01L 21/02491* (2013.01); *H01L 21/02502* (2013.01); *H01L 21/0254* (2013.01)

(58) Field of Classification Search
USPC ............ 257/79, E33.002; 438/22; 372/43.01, 372/45.011, 45.012
See application file for complete search history.

(56) References Cited

U.S. PATENT DOCUMENTS

| | | | |
|---|---|---|---|
| 6,426,512 B1* | 7/2002 | Ito et al. .......................... | 257/12 |
| 6,586,779 B2* | 7/2003 | Tsuda et al. ................... | 257/103 |
| 6,589,808 B2* | 7/2003 | Chiyo et al. .................... | 438/46 |
| 6,897,139 B2* | 5/2005 | Shibata et al. ................ | 438/606 |
| 2002/0175332 A1* | 11/2002 | Kaneyama et al. ............. | 257/79 |
| 2003/0080344 A1* | 5/2003 | Yoo ................ | 257/103 |
| 2004/0222434 A1* | 11/2004 | Uemura et al. ................. | 257/99 |
| 2005/0179045 A1* | 8/2005 | Ryu et al. ........................ | 257/94 |
| 2005/0217722 A1* | 10/2005 | Komatsu et al. .............. | 136/263 |
| 2007/0045607 A1* | 3/2007 | Chen et al. ....................... | 257/14 |

FOREIGN PATENT DOCUMENTS

| | | |
|---|---|---|
| CN | 1436375 A | 8/2003 |
| KR | 10-2003-0016266 A | 2/2003 |
| KR | 10-2005-0041536 A | 5/2005 |

* cited by examiner

*Primary Examiner* — Robert Huber
(74) *Attorney, Agent, or Firm* — Saliwanchik, Lloyd & Eisenschenk

(57) ABSTRACT

Provided are embodiments of a light emitting device and fabrication methods thereof. The light emitting device can include a buffer layer provided between a substrate and a semiconductor layer incorporating a high fusion point metal. In a fabrication method of the light emitting device, the buffer layer incorporating a high fusion point metal can be formed on a substrate, and a semiconductor layer can be formed on the buffer layer.

20 Claims, 3 Drawing Sheets

SEMICONDUCTOR LIGHT EMITTING DEVICE INCLUDING A METAL NITRIDE BUFFER LAYER AND FABRICATION METHOD THEREOF

RELATED APPLICATION

The present application claims the benefit under 35 U.S.C. §119 to Korean Patent Application No. 10-2006-0033828, filed Apr. 14, 2006, which is hereby incorporated by reference in its entirety.

BACKGROUND

Generally, a typical semiconductor light emitting device has a light emitting region containing ultraviolet, blue and green regions. In particular, a GaN-based light emitting device may be used for an optical device of a blue/green light emitting diode (LED), and an electronic device with high speed switching and high output power performance such as a metal semiconductor field effect transistor (MESFET), a hetero junction field effect transistor (HEMT), etc.

FIG. 1 is a cross-sectional view of a related art light emitting device 10.

Referring to FIG. 1, the related art light emitting device 10 is configured such that an n-type GaN layer 13, an active layer 15, and a p-type GaN layer 17 are sequentially stacked on a substrate 11 that is mainly formed of sapphire or SiC.

Silicon is doped into the n-type GaN layer 13 for reducing a drive voltage, and magnesium (Mg) is doped into the p-type GaN layer 17. The active layer 15 has a multi quantum well (MQW) structure. After an etching process is performed so as to expose a portion of the n-type GaN layer 13, a first electrode 19 is formed on the n-type GaN layer 13, and a second electrode 21 is formed on the p-type GaN layer 17.

When current is supplied to the light emitting device 10 from the outside through the first and second electrodes 19 and 21, light is emitted from the active layer 15.

The sapphire substrate 11 has a different lattice constant and crystal lattice from that of the n-type GaN layer 13 formed thereon. Accordingly, lattice mismatch such as dislocation, vacancy, etc, may occur at a boundary between the sapphire substrate 11 and the n-type GaN layer 13.

Thus, research is being advanced to reduce the lattice constant difference between the substrate 11 used in a light emitting device 10 and the nitride layer formed on the substrate 11, and to achieve good crystal lattice match therebetween.

BRIEF SUMMARY

Embodiments of the present invention provide a light emitting device that provides a buffer layer using a high fusion point metal, and a fabrication method thereof.

Embodiments of the present invention provide a light emitting device having good crystal lattice match with a nitride layer by forming a buffer layer on a substrate using a high fusion point metal, and a fabrication method thereof.

An embodiment of the present invention provides a light emitting device including: a buffer layer including a high fusion point metal; a first conductive semiconductor layer on the buffer layer; an active layer on the first conductive semiconductor layer; and a second conductive semiconductor layer on the active layer.

An embodiment of the present invention provides a light emitting device incorporating: a metal layer including a high fusion point metal; a metal nitride layer formed on the metal layer, the metal nitride being a metal of the same type as the high fusion point metal mixed with a nitride; an n-type semiconductor layer on the metal nitride layer; an active layer on the n-type semiconductor layer; and a p-type semiconductor layer on the active layer.

An embodiment of the present invention provides a method of fabricating a light emitting device, the method comprising: forming a buffer layer including a high fusion point metal; forming a first conductive semiconductor layer on the buffer layer; forming an active layer on the first conductive semiconductor layer; and forming a second conductive semiconductor layer on the active layer.

According to embodiments of the present invention, it is possible to reduce lattice defects between a substrate and a semiconductor layer by providing a buffer layer on the substrate using a high fusion point metal.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Reference will now be made in detail to the preferred embodiments of the present invention, examples of which are illustrated in the accompanying drawings. Wherever possible, the same reference numbers will be used throughout the drawings to refer to the same or like parts.

It will be understood that when an element is referred to as being 'on' or "under" a layer, it can be directly on/under the layer, and one or more intervening layers may also be present.

[First Embodiment]

Figure 1:
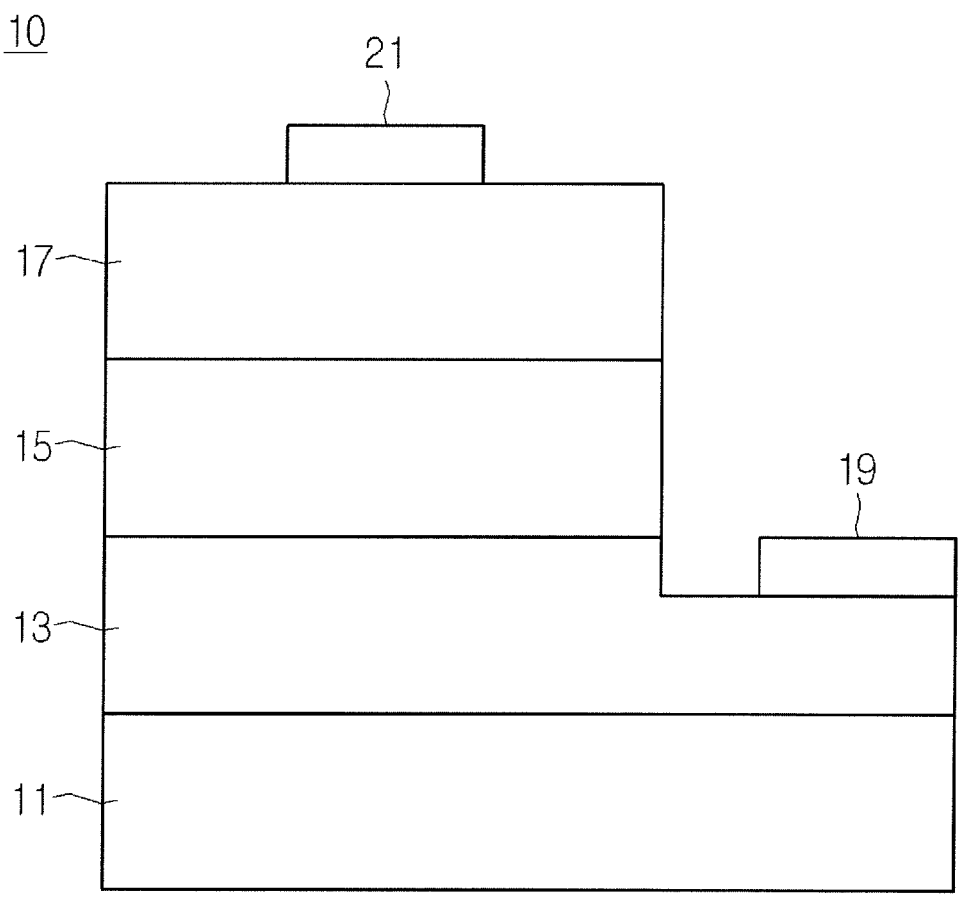
FIG. 1 is a cross-sectional view of a related art light emitting device.
Figure 2:
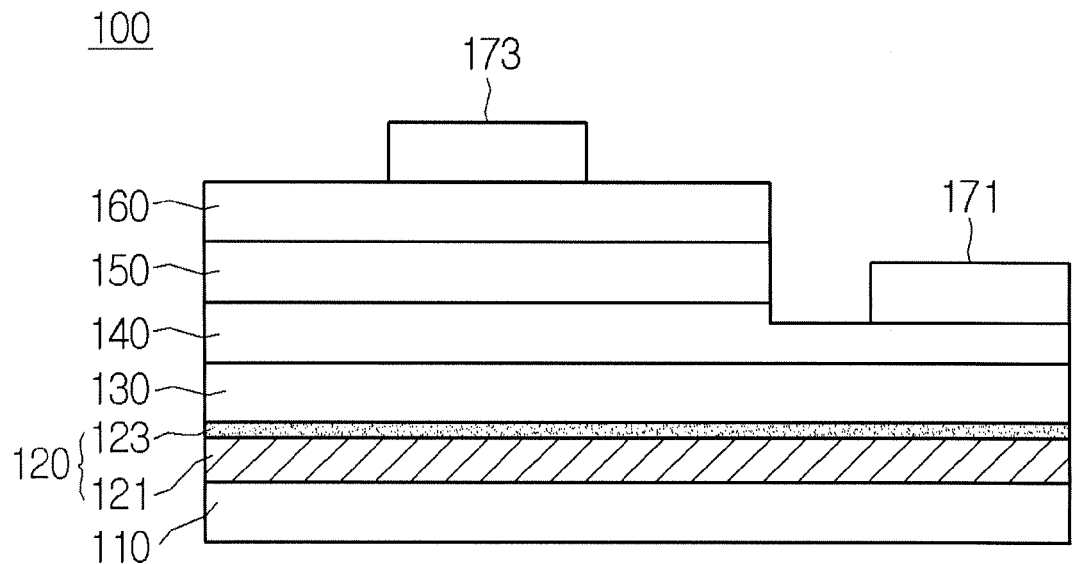
FIG. 2 is a cross-sectional view of a light emitting device according to a first embodiment of the present invention.
Figure 3A:
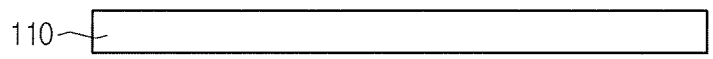
FIGS. 3(a) to 3(c) are sectional views illustrating a fabrication method according to an embodiment of the present invention of the light emitting device according to the first embodiment.
Figure 3B:
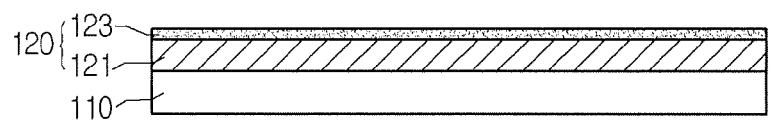
Figure 3C:
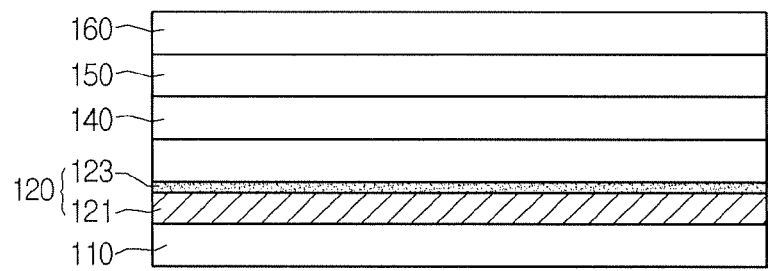

FIG. 2 is a cross-sectional view of a light emitting device 100 according to a first embodiment. FIGS. 3(a) to 3(c) are sectional views illustrating a fabrication method of the light emitting device 100 of FIG. 2.

Referring to FIGS. 2 and 3(a) to 3(c), the light emitting device 100 can include a substrate 110, a buffer layer 120 incorporating a high fusion point metal, an undoped nitride layer 130, a first conductive semiconductor layer 140, an active layer 150, a second conductive semiconductor layer 160, a first electrode 171, and a second electrode 173.

Referring to FIG. 3(a), a conductive substrate such as silicon (Si), silicon carbide (SiC), and gallium arsenide (GaAs), or a sapphire substrate may be used as the substrate 110.

Referring to FIG. 3(b), a buffer layer 120 can be formed on the substrate 110. The buffer layer 120 can be formed to have a single-layered or multi-layered structure using a high fusion point metal. For example, the buffer layer 120 may include a metal layer 121 and a metal nitride layer 123.

The metal layer 121 can be formed using at least one high fusion point metal. For example, at least one of molybdenum (Mo), nickel (Ni), and tungsten (W) can be used.

In a specific embodiment, the metal layer 121 can be formed of molybdenum. Because molybdenum has a similar lattice structure to a silicon substrate 110, the metal layer 121 can have a good lattice match with a silicon substrate 110. In addition, because the metal layer 121 formed of molybdenum has a similar crystal structure to the silicon substrate 110, electrical property can be enhanced.

In an embodiment, the metal layer 121 may be deposited by a vapor deposition process. The vapor deposition process may be performed by physical vapor deposition (PVD) using sputtering, E-beam evaporation, etc. The metal layer 121 can be formed to a thickness of several tens to several hundreds of nanometers by the PVD process.

The metal nitride layer 123 can be formed on the metal layer 121. The metal nitride layer 123 may be formed through nitrification of a metal which is the same as that used in the metal layer 121. For instance, when the metal layer 121 is formed of molybdenum, the metal nitride layer 123 can be formed of molybdenum nitride (MoN) in which molybdenum is mixed. Also, when the metal layer 121 is formed of nickel (Ni), the metal nitride layer 123 can be formed of nickel nitride (NiN). Likewise, when the metal layer 121 is formed of tungsten (W), the metal nitride layer 123 can be formed of tungsten nitride (WN).

In an embodiment, the metal nitride layer 123 employing molybdenum nitride can be formed through reaction of ammonia ($NH_3$) and molybdenum at 400-1100° C. using a metal organic chemical vapor deposition (MOCVD) chamber or a molecular beam epitaxy (MBE) chamber.

The metal nitride layer 123 can be formed to a thickness of several tens to several hundreds of angstroms such that the buffer layer can be formed to a thickness of several tens to several hundreds of nanometers on the substrate 110.

The following Table 1 illustrates crystal structures and lattice constants of GaN, three high fusion point metals and a silicon substrate, respectively.

TABLE 1

|  | Crystal structure | Lattice constant (Å) | Lattice mismatch with respect to GaN(%) | Thermal mismatch with respect to GaN(%) | Thermal expansion coefficient ($\times 10^{-6}$/K) |
|---|---|---|---|---|---|
| GaN | Wurtzite | a = 3.1876<br>c = 5.1846 |  |  | 5.59 |
| Mo | BCC | a = 3.1468 | 1.3% | 14.1% | 4.9 |
| Ni | FCC | a = 3.5167 | 9% | 58% | 13.3 |
| W | BCC | a = 3.158 | 0.9% | 21.5% | 4.6 |
| Si | Diamond Cubic | a = 3.8403 | 17% | 55% | 3.6 (2.8~7.3) |

Here, BCC denotes body-centered cubic, FCC denotes face-centered cubic, and the lowercase letters a and c denote a-axis and c-axis, respectively, in each crystal structure.

As illustrated in Table 1, the lattice constants of an Si substrate, GaN, molybdenum, nickel and tungsten are a=3.8403 Å, 3.1876 Å, 3.1468 Å, 3.5167 521 and 3.158 Å, respectively. By using a high fusion point metal having minimum lattice mismatch between the substrate and the semiconductor layer, it can be possible to minimize the lattice mismatch between the substrate and the semiconductor layer (GaN layer). Also, by suppressing the generation of dislocation caused by the lattice mismatch, the stress resulting from the lattice mismatch can also be reduced so that the characteristic of the semiconductor layer (GaN layer) can be improved.

In an embodiment, a predetermined metal having a lattice constant difference from GaN in the range of 5-10% may be used. The predetermined metal can be selected among high fusion point metals having a melting point of 2000° C. or higher, such as, for example, W (3387° C.), Re (3180° C.), Ta (2996° C.), Os (2700° C.), Mo (2610° C.), Nb (2468° C.), Ir (2447° C.), Ru (2250° C.), Hf (2150° C.), and Ti (1700° C.).

An undoped nitride layer 130 can be formed on the buffer layer 120. The undoped nitride layer 130 may be formed to a thickness of approximately 300 nm by supplying $NH_3$ (4.0× $10^{-2}$ mol/min) and trimethylgallium (TMGa, $1.0 \times 10^{-4}$ mol/min) at a growth temperature of approximately 700° C. In some embodiments when the occasion demands, this undoped GaN layer may not be formed.

Referring to FIG. 3(c), a First conductive semiconductor layer 140, which can act as a first electrode contact layer, can be formed on the undoped nitride layer 130. The first conductive semiconductor layer 140 may be formed of an n-type GaN layer. The n-type GaN layer may be formed by supplying $NH_3$ ($3.7 \times 10^{-2}$ mol/min), TMGa ($1.2 \times 10^{-4}$ mol/min), and silane gas ($6.3 \times 10^{-9}$ mol/min) containing an n-type dopant (e.g., silicon). In addition, the n-type GaN layer may be formed to a thickness of approximately 2 µm on an undoped GaN layer 130.

The active layer 150 having single quantum well (SQW) or multi quantum well (MQW) structure can be formed on the first conductive semiconductor layer 140. For example, the active layer 150 may be formed by supplying $NH_3$, TMGa and trimethylindium (TMIn) using nitrogen gas as carrier gas to grow InGaN and GaN layers at a growth temperature of 780° C. The active layer 150 may be formed to a thickness ranging from 120 Å to 1200 Å.

The second conductive semiconductor layer 160, which can act as a second electrode contact layer, can be formed on the active layer 150. The second conductive semiconductor layer 160 may be formed of a p-type GaN layer. The p-type GaN layer can be formed at growth temperature of 1000° C. or higher by supplying TMGa and $Cp_2Mg$.

Referring to FIG. 2, after forming the second conductive semiconductor layer 160, the second conductive semiconductor layer 160, the active layer 150, and the first conductive semiconductor layer 140 can be partially etched to expose a portion of the first conductive layer 140. In an embodiment, the etching can be performed using an anisotropic wet etching process.

A first electrode 171 can be formed on the first conductive semiconductor layer 140, and a second electrode 173 is formed on the second conductive semiconductor layer 160. Here, the first electrode 171 serves as an n-type electrode, and the second electrode 173 serves as a p-type electrode. In an embodiment, the n-type electrode may be formed of titanium (Ti), and the p-type electrode may be formed of nickel. Also, the p-type electrode 173 may be embodied as a transparent electrode formed of ITO, ZnO, RuOx, TiOx, IrOx, or the like.

In operation, current can be supplied to the first and second electrodes 171 and 173 from the outside so that light is emitted when holes and electrons are combined with each other in the active layer 150, wherein the holes can be applied to the second conductive semiconductor layer 160, and the electrons can be applied to the first conductive semiconductor layer 140.

In the first embodiment, the light emitting device is described having an np junction structure in which the first electrode 171 is formed on the first conductive semiconductor layer 140, and the second electrode 173 is formed on the second conductive semiconductor layer 160. Alternatively, the light emitting device may be realized such that it has a pn junction structure.

[Second Embodiment]

Figure 4:
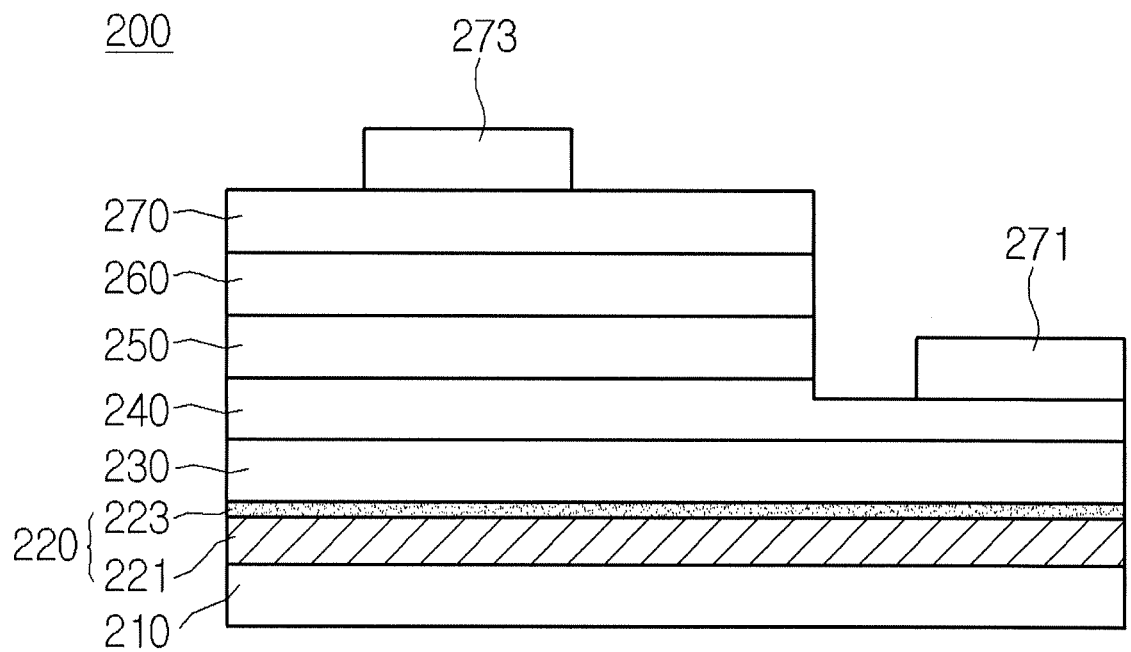
FIG. 4 is a cross-sectional view of a light emitting device according to a second embodiment of the present invention.

FIG. 4 is a cross-sectional view of a light emitting device 200 according to a second embodiment.

Referring to FIG. 4, the light emitting device 200 can include a substrate 210, a buffer layer 220, an undoped nitride layer 230, a first conductive semiconductor layer 240, an active layer 250, a second conductive semiconductor layer 260, a third conductive semiconductor layer 270, a first electrode 271, and a second electrode 273.

A conductive substrate such as Si, SiC, and GaAs, or a sapphire substrate may be used as the substrate 210.

The buffer layer 220 can be formed on the substrate 210. The buffer layer 220 may be formed to have a single-layered or multi-layered structure using a high fusion point metal. For example, the buffer layer 220 may include a metal layer 221 and a metal nitride layer 223.

The metal layer 221 can be formed of a high fusion point metal such as Mo, Ni, W, etc. Also, in embodiments, a predetermined metal having a lattice constant difference from GaN in the range of 5-10%, may be used, and can be selected among high fusion point metals having a melting point of 2000° C. or higher, e.g., W (3387° C.), Re (3180° C.), Ta (2996° C.), Os (2700° C.), Mo (2610° C.), Nb (2468° C.), Ir (2447° C.), Ru (2250° C.), Hf (2150° C.), Ti (1700° C.), etc.

In a specific embodiment, the metal layer 221 can be formed of molybdenum. Because molybdenum has a similar lattice structure to a silicon substrate 210, the metal layer 221 can have good lattice match with a silicon substrate 210. In addition, because the metal layer 221 formed of molybdenum has a similar crystal structure to the silicon substrate 210, electrical property can be enhanced.

In an embodiment, the metal layer 221 may be deposited on the substrate 210 by a vapor deposition method. The vapor deposition method may be performed by physical vapor deposition (PVD) method using sputtering, E-beam evaporation, etc.

The metal layer 221 can be formed to a thickness of several tens to several hundreds of nanometers by the PVD method.

The metal nitride layer 223 can be formed on the metal layer 221. The metal nitride layer 223 may be formed through nitrification of a metal which is the same as that used in the metal layer 221. For instance, when the metal layer 221 is formed of molybdenum, the metal nitride layer 223 can be formed of molybdenum nitride (MoN) in which molybdenum is mixed. Also, when the metal layer 221 is formed of nickel, the metal nitride layer 223 can be formed of nickel nitride (NiN). Likewise, when the metal layer 221 is formed of tungsten, the metal nitride layer 223 can be formed of tungsten nitride (WN).

In an embodiment, the metal nitride layer 223 employing molybdenum nitride can be formed through reaction of ammonia ($NH_3$) and molybdenum in a temperature range of 400-1100° C. using a metal organic chemical vapor deposition (MOCVD) chamber or a molecular beam epitaxy (MBE) chamber.

The metal nitride layer 223 can be formed to a thickness of several tens to several hundreds of angstroms such that the buffer layer 220 can be formed to a thickness of several tens to several hundreds of nanometers on the substrate 210.

The undoped nitride layer 230 into which dopant is not doped can be formed on the buffer layer 220. This undoped nitride layer 230 may not be formed if necessary.

The first conductive semiconductor layer 240 can be formed on the undoped nitride layer 230. The first conductive semiconductor layer 240 can serve as a first electrode contact layer, and can be formed of an n-type GaN layer.

The active layer 250 having an SQW or MQW structure can be formed on the first conductive semiconductor layer 240. The active layer 250 can have a structure of InGaN and GaN layers.

The second conductive semiconductor layer 260 can be formed on the active layer 250. The second conductive semiconductor layer 260 may be formed of a p-type AlGaN layer. The p-type AlGaN layer can be formed by supplying TMGa ($7 \times 10^{-6}$ mol/min), trimethylaluminum (TMAl, $2.6 \times 10^{-5}$ mol/min), bisethyl cyclopentadienyl magnesium ($EtCp_2Mg$, $5.2 \times 10^{-7}$ mol/min) expressed as $Mg(C_2H_5C_5H_4)_2$, and $NH_3$ ($2.2 \times 10^{-1}$ mol/min) at an ambient temperature of 1000° C. using hydrogen gas as carrier gas. The p-type AlGaN layer can be formed to a thickness ranging from 0.02 µm to 0.1 µm on the active layer 250. Thereafter, an annealing process can be performed for, for example, 5 minutes at 950° C. so that it is possible to control the p-type AlGaN layer to have maximum hole concentration.

The third conductive semiconductor layer 270 can be formed on the second conductive semiconductor layer 260. The third conductive semiconductor layer 270 can serve as an electrode contact layer, and may be formed of an n-type GaN layer. The n-type GaN layer may be, for example, formed by supplying $NH_3$ ($3.7 \times 10^{-2}$ mol/min), TMGa ($1.2 \times 10^{-4}$ mol/min), and silane gas ($6.3 \times 10^{-9}$ mol/min) containing n-type dopant such as silicon. In addition, the n-type GaN layer may be formed to a thickness of tens of nanometers.

After forming the third conductive semiconductor layer 270, the third and second conductive semiconductor layers 270 and 260, the active layer 250 and the first conductive semiconductor layer 240 can be partially etched to expose a portion of the first conductive layer 240. In an embodiment, the etching can be performed using an anisotropic wet etching process.

The first electrode 271 can be formed on the first conductive semiconductor layer 240, and the second electrode 273 can be formed on the third conductive semiconductor layer 270. Here, the first electrode 271 serves as an n-type electrode, and the second electrode 273 serves as a p-type electrode. In an embodiment, n-type electrode may be formed of titanium, and the p-type electrode may be formed of nickel. Also, the p-type electrode may be embodied as a transparent electrode incorporating a material such as ITO, ZnO, RuOx, TiOx, IrOx, and the like.

In operation, current can be supplied to the first and second electrodes 271 and 273 from the outside so that light can be emitted when holes and electrons are combined with each other in the active layer 250, wherein the holes can be applied to the second conductive semiconductor layer 260 through the third conductive semiconductor layer 270, and the electrons can be applied to the first conductive semiconductor layer 240.

In the second embodiment, the light emitting device is described having an npn junction structure in which the n-type electrode is formed on the first conductive semiconductor layer 240, and the p-type electrode is formed on the third conductive semiconductor layer 270. Alternatively, the light emitting device may be embodied such that it has a pnp junction structure. For example, the light emitting device may have pnp junction structure by forming the first, second and third conductive semiconductor layers of a first p-type GaN layer, an n-type GaN layer, and a second p-type GaN layer, respectively.

The first and second embodiments illustrate a horizontal semiconductor light emitting device in which the electrode of the light emitting device is disposed over the substrate. The light emitting device of the first and second embodiments may be used where the substrate is separated from the metal layer.

[Third Embodiment]

Figure 5:
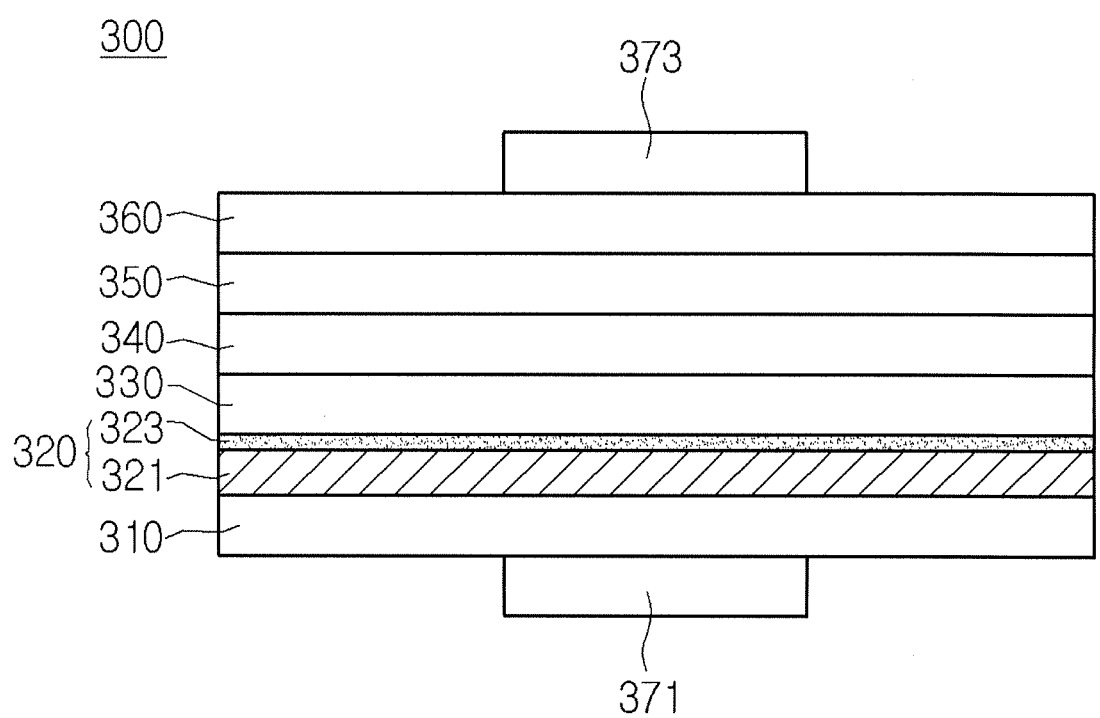
FIG. 5 is a cross-sectional view of a light emitting device according to a third embodiment of the present invention.

FIG. 5 is a cross-sectional view of a light emitting device 300 according to a third embodiment. The light emitting device 300 of the third embodiment is a vertical nitride semiconductor light emitting device in which electrodes are disposed on top and bottom surfaces thereof.

Referring to FIG. 5, the light emitting device 300 can include a substrate 310, a buffer layer 320, an undoped nitride layer 330, a first conductive semiconductor layer 340, an active layer 350, a second conductive semiconductor layer 360, a first electrode 371, and a second electrode 373.

A conductive substrate such as Si, SiC, GaAs, etc, may be used as the substrate 310.

The buffer layer 320 can be formed on the substrate 310. The buffer layer 320 can be formed to have a single-layered or multi-layered structure using a high fusion point metal. For example, the buffer layer 320 may include a metal layer 321 and a metal nitride layer 323. The metal layer 321 can be formed using at least one high fusion point metal such as Mo, Ni, W, etc. Also, in an embodiment, a predetermined metal having a lattice constant difference from GaN in the range of 5-10%, may be used, and can be selected among high fusion point metals having a melting point of 2000° C. or higher, e.g., W (3387° C.), Re (3180° C.), Ta (2996° C.), Os (2700° C.), Mo (2610° C.), Nb (2468° C.), Ir (2447° C.), Ru (2250° C.), Hf (2150° C.), Ti (1700° C.), etc.

In a specific embodiment, the metal layer 321 can be formed of molybdenum. Because molybdenum has a similar lattice structure to a silicon substrate 310, the metal layer 321 can have good lattice match with the silicon substrate 310. In addition, because the metal layer 321 formed of molybdenum has similar crystal structure to the silicon substrate 310, electrical property can be enhanced.

In an embodiment, the metal layer 221 may be deposited on the substrate 310 by a vapor deposition process. The vapor deposition may be performed by a PVD process using sputtering, E-beam evaporation, etc. The metal layer 321 can be formed to a thickness of several tens to several hundreds of nanometers by the PVD process.

The metal nitride layer 323 can be formed on the metal layer 321. The metal nitride layer 323 may be formed using a metal which is the same as that used in the metal layer 321. For instance, when the metal layer 321 is formed of molybdenum, the metal nitride layer 323 can be formed of molybdenum nitride (MoN) in which molybdenum is mixed. Also, when the metal layer 321 is formed of nickel, the metal nitride layer 323 can be formed of nickel nitride (NiN). Likewise, when the metal layer 321 is formed of tungsten, the metal nitride layer 323 can be formed of tungsten nitride (WN).

The metal nitride layer 323 employing molybdenum nitride can be formed through reaction of ammonia ($NH_3$) and molybdenum in a temperature range of 400-1100° C. using an MOCVD chamber or an MBE chamber.

The metal nitride layer 323 can be formed to a thickness of several tens to several hundreds of angstroms such that the buffer layer 320 can be formed to a thickness of several tens to several hundreds of nanometers on the substrate 310.

The undoped nitride layer 330 into which dopant is not doped can be formed on the buffer layer 320. This undoped nitride layer 330 may not be formed if necessary.

The first conductive semiconductor layer 340 can be formed on the undoped nitride layer 330. The first conductive semiconductor layer 340 can serve as a first electrode contact layer, and can be formed of an n-type GaN layer.

The active layer 350 having an SQW or MQW structure can be formed on the first conductive semiconductor layer 340. The active layer 350 can be formed to have a structure of InGaN and GaN layers.

The second conductive semiconductor layer 360 can be formed on the active layer 350. The second conductive semiconductor layer 360 may be formed of a p-type GaN layer using p-type dopant.

After forming the second conductive semiconductor layer 360, the first electrode 371 can be formed under the substrate 310, and the second electrode 372 can be formed on the second conductive semiconductor layer 360. Here, the first electrode 371 serves as an n-type electrode, and the second electrode 373 serves as a p-type electrode. In an embodiment, the n-type electrode may be formed of titanium, and the p-type electrode may be formed of nickel. Also, the p-type electrode 373 may be embodied as a transparent electrode incorporating a material such as ITO, ZnO, RuOx, TiOx, IrOx, and the like.

In operation, current can be supplied to the first and second electrodes 371 and 373 from the outside so that light is emitted when holes and electrons are combined with each other in the active layer 350, wherein the holes can be applied to the second conductive semiconductor layer 360, and the electrons can be applied to the first conductive semiconductor layer 340 through the substrate 310.

The light emitting device according to the third embodiment may be modified so as to have np junction, pn junction, npn junction, or pnp junction. Also, the substrate 310 may be separated from the metal layer 320 using a laser or the like. In the case where the substrate is removed, the first electrode 371 can be formed directly under the metal layer 320.

In embodiments of the present invention, it is possible to reduce lattice mismatch between a substrate and a semiconductor layer by providing a buffer layer using a high fusion point metal such as Mo, Ni, W, etc, between the substrate and a nitride layer. Also, by suppressing the generation of dislocation caused by the lattice mismatch, the stress resulting from the lattice mismatch is reduced so that the characteristic of the semiconductor layer (GaN layer) can be improved.

In addition, a buffer layer having excellent crystal lattice match can be provided on the substrate to prevent constitution elements of the substrate from being doped into the semiconductor layer. Thus, the operation reliability of the semiconductor light emitting device can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device, comprising:
    a substrate including a bottom surface having a first central region and a first peripheral region outside the first central region;
    a first conductive semiconductor layer formed on the substrate;
    a metal layer between the substrate and the first conductive semiconductor layer and comprising a metal material having a substantially similar lattice structure to the substrate and having a lattice constant difference from the first conductive semiconductor layer in a range of 5-10% and having a melting point of 2,000° C. or higher;
    a metal nitride layer between the metal layer and the first conductive semiconductor layer and comprising at least the same metal material as that of the metal layer;
    an active layer on the first conductive semiconductor layer;
    a second conductive semiconductor layer on the active layer and including an upper surface having a second central region and a second peripheral region outside the second central region;
    a first electrode on the first central region of the bottom surface of the substrate; and
    a second electrode on the second central region of the upper surface of the second conductive semiconductor layer,
    wherein the substrate is a conductive substrate,
    wherein the first peripheral region of the bottom surface of the substrate is exposed,
    wherein the second peripheral region of the upper surface of the second conductive semiconductor layer is exposed,
    wherein the metal layer is in direct physical contact with the substrate,
    wherein the metal nitride layer is in direct physical contact with the metal layer,
    wherein the metal layer comprises at least one of molybdenum, nickel, and tungsten; and
    wherein the metal nitride layer comprises at least one of molybdenum nitride, nickel nitride, and tungsten nitride.

2. The semiconductor light emitting device according to claim 1, wherein the metal layer comprises molybdenum.

3. The semiconductor light emitting device according to claim 2, wherein the metal nitride layer comprises molybdenum nitride.

4. The semiconductor light emitting device according to claim 1, wherein the first conductive semiconductor layer comprises a n-type semiconductor layer, and
    the second conductive semiconductor layer comprises a p-type semiconductor layer.

5. The semiconductor light emitting device according to claim 1, wherein the first conductive semiconductor layer comprises a p-type semiconductor layer, and
    the second conductive semiconductor layer comprises a n-type semiconductor layer.

6. The semiconductor light emitting device according to claim 1, wherein the second electrode comprises a transparent electrode.

7. A semiconductor light emitting device comprising:
    a substrate including a bottom surface having a first central region and a first peripheral region outside the first central region;
    a first conductive semiconductor layer formed on the substrate;
    a metal layer between the substrate and the first conductive semiconductor layer and comprising a metal material having a substantially similar lattice structure to the substrate and having a lattice constant difference from the first conductive semiconductor layer in a range of 5-10% and having a melting point of 2,000° C. or higher;
    a metal nitride layer between the metal layer and the first conductive semiconductor layer and comprising at least the same metal material as that of the metal layer;
    an active layer on the first conductive semiconductor layer;
    a second conductive semiconductor layer on the active layer and including an upper surface having a second central region and a second peripheral region outside the second central region;
    a first electrode formed directly on and in contact with the first central region of the bottom surface of the substrate; and
    a second electrode on the second central region of the upper surface of the second conductive semiconductor layer,
    wherein the metal material comprises at least one metallic material selected from the group consisting of Re, Os, Nb, Ir, Ru, and W,
    wherein the first peripheral region of the bottom surface of the substrate is exposed,
    wherein the second peripheral region of the upper surface of the second conductive semiconductor layer is exposed,
    wherein the metal layer is in direct physical contact with the substrate, and
    wherein the metal nitride layer is in direct physical contact with the metal layer.

8. The semiconductor light emitting device according to claim 1, wherein the substrate includes one of SiC and Si.

9. The semiconductor light emitting device according to claim 1, wherein the metal layer has a thickness thicker than that of the metal nitride layer.

10. The semiconductor light emitting device according to claim 7, wherein the metal layer has a thickness thicker than that of the metal nitride layer.

11. The semiconductor light emitting device according to claim 1, wherein the first peripheral region and the second peripheral region are overlapped with each other.

12. The semiconductor light emitting device according to claim 7, wherein the first peripheral region and the second peripheral region are overlapped with each other.

13. The semiconductor light emitting device according to claim 1, further comprising an undoped nitride layer disposed between the metal nitride layer and the first conductive semiconductor layer, wherein the undoped nitride layer is in direct physical contact with both the metal nitride layer and the first conductive semiconductor layer.

14. The semiconductor light emitting device according to claim 7, further comprising an undoped nitride layer disposed between the metal nitride layer and the first conductive semiconductor layer, wherein the undoped nitride layer is in direct physical contact with both the metal nitride layer and the first conductive semiconductor layer.

15. The semiconductor light emitting device according to claim 1, wherein the first conductive semiconductor layer is in direct physical contact with the metal nitride layer.

16. The semiconductor light emitting device according to claim 7, wherein the first conductive semiconductor layer is in direct physical contact with the metal nitride layer.

17. The semiconductor light emitting device according to claim 7, wherein the metal nitride layer comprises at least one of rhenium nitride, osmium nitride, niobium nitride, iridium nitride, ruthenium nitride, and tungsten nitride.

18. The semiconductor light emitting device according to claim 17, wherein the metal material comprises at least one of Re, Os, Ir, and W; and wherein the metal nitride layer comprises at least one of rhenium nitride, osmium nitride, iridium nitride, and tungsten nitride.

19. The semiconductor light emitting device according to claim 7, wherein the metal material comprises at least one of Re, Os, Ir, and W.

20. The semiconductor light emitting device according to claim 19, wherein the metal nitride layer comprises at least one of rhenium nitride, osmium nitride, iridium nitride, and tungsten nitride.

\* \* \* \* \*